(12) United States Patent
Fujisawa et al.

(10) Patent No.: US 6,780,769 B2
(45) Date of Patent: Aug. 24, 2004

(54) METHOD OF MANUFACTURING STRUCTURE FOR CONNECTING INTERCONNECT LINES INCLUDING METAL LAYER WITH THICKNESS LARGER THAN THICKNESS OF METALLIC COMPOUND LAYER

(75) Inventors: Masahiko Fujisawa, Tokyo (JP); Akihiko Ohsaki, Tokyo (JP); Noboru Morimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/464,502

(22) Filed: Jun. 19, 2003

(65) Prior Publication Data

US 2003/0205825 A1 Nov. 6, 2003

Related U.S. Application Data

(62) Division of application No. 09/978,005, filed on Oct. 17, 2001.

(30) Foreign Application Priority Data

May 15, 2001 (JP) ...................................... P2001-144957

(51) Int. Cl.$^7$ ...................... H01L 21/44; H01L 21/4763
(52) U.S. Cl. ...................... 438/687; 438/627; 438/648; 438/685
(58) Field of Search ............................... 438/622, 626, 438/627, 648, 683, 685, 687; 257/751–753, 758–764, 767, 746

(56) References Cited

U.S. PATENT DOCUMENTS 6,127,258 A 10/2000 Watanabe et al. ........... 438/625
6,291,885 B1 9/2001 Cabral, Jr. et al. .......... 257/751
6,323,121 B1 11/2001 Liu et al. ..................... 438/633
6,342,448 B1 1/2002 Lin et al. ..................... 438/687

FOREIGN PATENT DOCUMENTS

| JP | 9-17790 | 1/1997 |
|----|---------|--------|
| JP | 2000-49137 | 2/2000 |
| JP | 2000-124310 | 4/2000 |
| JP | 2000-183064 | 6/2000 |
| JP | 2001-44205 | 2/2001 |
| JP | 2001-53151 | 2/2001 |

*Primary Examiner*—Hung Vu
(74) *Attorney, Agent, or Firm*—Oblon, Spivak, McClelland, Maier & Neustadt, P.C.

(57) ABSTRACT

A metal layer (7), a metallic compound layer (8) and a metal layer (9) are stacked in this order when viewed from the side of a first copper interconnect line (2) and an interlayer insulating film (5) to constitute a second conductive barrier layer (20). As the material for the metal layers (7) and (9), an element having an atomic weight higher than that of copper such as tungsten (W) or tantalum (Ta) is applicable. A second copper interconnect line (6) is conductively connected to the first copper interconnect line (2) at a contact hole (12) through the second conductive barrier layer (20). As the ratio of the volume of the second copper interconnect line (6) at the region for filling a trench (11) to the volume of the second copper interconnect line (6) at the region for filling the contact hole (12) increases, tensile stress to be concentrated at the contact hole (12) becomes greater. As a result, a void is likely to be generated in the contact hole (12). In view of this, in order to improve the adhesion especially between the second copper interconnect line (6) at the region for filling the contact hole (12) and the second conductive barrier layer (20), the metal layer (9) is provided.

7 Claims, 7 Drawing Sheets ic # METHOD OF MANUFACTURING STRUCTURE FOR CONNECTING INTERCONNECT LINES INCLUDING METAL LAYER WITH THICKNESS LARGER THAN THICKNESS OF METALLIC COMPOUND LAYER

BACKGROUND OF THE INVENTION

1. Field of the Invention

The present invention relates to a technique for connecting interconnect lines and more particularly, to a technique for connecting a pair of interconnect lines in a semiconductor device stacked in a direction of a thickness of the semiconductor device, for example.

2. Description of the Background Art

In a semiconductor integrated circuit undergoing development in scaledown, attention has been directed to interconnection delay as a factor in inhibiting increase in operating speed of a device. The delay in semiconductor integrated circuit is the sum of the delay in transistor as a semiconductor element and the delay in interconnection for connecting transistors. When it is required to reduce dimensions of each type of element for constituting the semiconductor device for realizing scaledown, the delay in transistor is reduced according to a scaling law. In contrast, the interconnection delay determined in proportion to the product of interconnection resistance and interconnection capacitance is increased. In view of this, it follows that the reduction in interconnection resistance brings reduction in interconnection delay, offering enhanced speed of the semiconductor device.

Instead of aluminum-based material conventionally employed, it has been suggested to employ copper (Cu) as a material for interconnection having a lower resistivity. An interconnect line made of copper (hereinafter referred to as "copper interconnect line") is desirable as compared with an interconnect line made of aluminum-based material in that it has a high resistance to electromigration.

As compared with aluminum-based interconnection material, however, it is hard to perform dry etching on copper. For this reason, in order to form the copper interconnect line, a so-called "Damascene" technique is employed in many cases. According to this technique, a trench is provided in an insulating film. This trench is filled with metal and a redundant part of metal is removed by polishing, for example. Then the metal remains in the trench is employed as an interconnect line.

Copper is further characterized in that when it goes into silicon, a deep level is formed in a band gap of silicon. Therefore, copper included in a MOS transistor for constituting an integrated circuit will cause a serious deterioration in characteristics of the MOS transistor. In addition, copper is likely to diffuse into a silicon oxide film generally used as an insulating layer of the semiconductor device. In view of the foregoing, it is necessary to surround the copper interconnect line with a film for preventing diffusion of copper.

FIG. 13 is a sectional view illustrating the structure of a pair of copper interconnect lines provided by Damascene technique. An insulating film 101, a first insulating barrier layer 104, an interlayer insulating film 105 and a second insulating barrier layer 108 are stacked in this order. Also provided under the insulating film 101 (that is, on the side opposite to the second insulating barrier layer 108) is a semiconductor substrate (not shown) for holding a semiconductor element formed therein.

A copper interconnect line 102 is embedded in the insulating film 101 and the bottom surface and side surfaces of the first copper interconnect line 102 are covered with a first conductive barrier layer 103. A second copper interconnect line 106 is embedded in the interlayer insulating film 105 and the bottom surfaces and side surfaces of the second copper interconnect line 106 are covered with a second conductive barrier layer 107. The first copper interconnect line 102 and the second copper interconnect line 106 are positioned adjacent to each other through the second conductive barrier layer 107 and electrically connected to each other. Except this neighboring area, the first copper interconnect line 102 and the second copper interconnect line 106 are isolated from each other by the first insulating barrier layer 104 and the interlayer insulating film 105. When further copper interconnect line is provided in the interlayer insulating film 105 other than the second copper interconnect line 106, it is a matter of course that the copper interconnect other than the second copper interconnect line 106 and the second copper interconnect line 106 are to be isolated from each other by the interlayer insulating film 105.

A silicon oxide film is applicable as the insulating film 101 and the interlayer insulating film 105, for example. As the first insulating barrier layer 104 and the second insulating barrier layer 108, a silicon nitride film and a silicon carbide film are applicable, for example, for increasing strength of the insulating film 101 and the interlayer insulating film 105 and for obtaining isolation between the layers. As the first conductive barrier layer 103 and the second conductive barrier layer 107, a metallic compound having conductivity is employed in many cases for reducing interconnection resistance and establishing electrical connection between the first copper interconnect line 102 and the second copper interconnect line 106 while preventing diffusion of copper from the copper interconnect lines into the insulating film 101 and the interlayer insulating film 105.

However, the silicon oxide film to be employed as the insulating film 101 and the interlayer insulating film 105 has a thermal expansion coefficient of $1.21 \times 10^{-7}/K$ while copper has a thermal expansion coefficient of $1.67 \times 10^{-5}/K$. That is, the thermal expansion coefficient of copper is considerably higher than that of the silicon oxide film. After formation of the copper interconnect lines, thermal processings are performed for forming the insulating films or in an atmosphere including hydrogen and in a temperature of about 400° C., for example, for recovering damage to the semiconductor element not shown such as a transistor that is caused during formation of the copper interconnect lines. Further, the rise in temperature is caused by Joule heat that is generated upon energizing the semiconductor integrated circuit. It view of these, it follows that there occurs tensile stress in the copper interconnect lines.

Turning to the metallic compound to be employed as the first conductive barrier layer 103 and the second conductive barrier layer 107 having the property of preventing diffusion of copper into the outside, it generally has poor adhesion to copper. Further, the second copper interconnect line 106 has a small diameter at the region neighboring on the first copper interconnect line 102 and the tensile stress described above is likely to be concentrated especially at this region. As a result, a void may be generated in the second copper interconnect line 106 at the region of a small diameter thereof (contact hole). This void will cause failure in electrical connection between the second copper interconnect line 106 and the first copper interconnect line 102.

As a countermeasure against the foregoing, a technique of using a stacked layer including titanium having good adhesion to copper and a metallic compound sandwiched between titanium has been suggested as a structure especially of the second conductive barrier layer 107. According to the structure illustrated in FIG. 13, Japanese Patent Application Laid-Open No. 2000-183064 discloses, for example, the technique of providing a barrier layer having a three sublayer structure of Ti/TiN/Ti between the second copper interconnect line 106 and the first copper interconnect line 102.

In the structure having direct connection between titanium (Ti) and copper, however, there arises a problem in that titanium easily diffuses into the copper interconnect lines to thereby form an alloy. The alloy formed in this way has a resistivity higher than that of copper and therefore, causes rise in interconnection resistance and in interface resistance at the contact hole.

SUMMARY OF THE INVENTION

A first aspect of the present invention is directed to a structure for connecting interconnect lines, comprising: a first copper interconnect line; a second copper interconnect line including a first portion and a second portion having a diameter smaller than that of the first portion; and an interposed layer provided between the first copper interconnect line and the second portion, wherein the interposed layer includes a first metal layer made of an element having an atomic weight higher than that of copper, and the first metal layer is in contact with the second portion.

According to a second aspect of the present invention, the structure for connecting interconnect lines of the first aspect further comprises an interlayer insulating film in which the second copper interconnect line is embedded.

According to a third aspect of the present invention, in the structure for connecting interconnect lines of the first or second aspect, the interposed layer further includes a metallic compound layer provided on a side opposite to the second copper interconnect line with the first metal layer provided therebetween.

According to a fourth aspect of the present invention, in the structure for connecting interconnect lines of the third aspect, the interposed layer further includes a second metal layer having contact with the first copper interconnect line.

According to a fifth aspect of the present invention, in the structure for connecting interconnect lines of the fourth aspect, the second metal layer is made of an element having an atomic weight higher than that of copper.

According to a sixth aspect of the present invention, in the structure for connecting interconnect lines of the fifth aspect, the first metal layer and the second metal layer are made of a same metallic element, and the metallic compound layer includes the same metallic element as a main metallic element thereof.

According to a seventh aspect of the present invention, in the structure for connecting interconnect lines of the third aspect, the first metal layer has a thickness larger than that of the metallic compound layer.

According to an eighth aspect of the present invention, in the structure for connecting interconnect lines of any one of the first to seventh aspects, the thickness of the first metal layer is 1 nm or more.

An ninth aspect of the present invention is directed to a method of manufacturing a structure for connecting interconnect lines, comprising the steps of: (a) forming a first copper interconnect line; (b) forming an interposed layer on the first copper interconnect line; and (c) forming a second copper interconnect line on the interposed layer, wherein the step (b) comprises the steps of: (b-1) forming a metallic compound layer after the step (b); and (b-2) forming a first metal layer on the metallic compound layer, contact is established between the second copper interconnect line and the first metal layer in the step (c), and the first metal layer is made of a metallic element having an atomic weight higher than that of copper.

According to a tenth aspect of the present invention, in the method of manufacturing a structure for connecting interconnect lines of the ninth aspect, the step (b-1) and the step (b-2) are sequentially performed in an oxygen-free environment.

According to an eleventh aspect of the present invention, in the method of manufacturing a structure for connecting interconnect lines of the tenth aspect, the metallic compound layer includes the metallic element as a main metallic substance which is a material for the first metal layer.

According to a twelfth aspect of the present invention, in the method of manufacturing a structure for connecting interconnect lines of any one of the ninth to eleventh aspects, the step (b) further comprises the step of (b-3) forming a second metal layer to be in contact with the first copper interconnect line, and the step (b-3), the step (b-2) and the step (b-1) are sequentially performed in this order in an oxygen-free environment.

According to a thirteenth aspect of the present invention, in the method of manufacturing a structure for connecting interconnect lines of the twelfth aspect, the metallic compound layer includes a metallic element as a main metallic substance which is a material for the second metal layer.

According to a fourteenth aspect of the present invention, in the method of manufacturing a structure for connecting interconnect lines of the twelfth or thirteenth aspect, the second metal layer is made of the metallic element having an atomic weight higher than that of copper.

According to a fifteenth aspect of the present invention, the method of manufacturing a structure for connecting interconnect lines of any one of the ninth to fourteenth aspects further comprises the step of: (d) forming a copper film on the first metal layer between the step (b) and the step (c), wherein the second copper interconnect line is formed through electrolytic plating using the copper film as a seed layer, and the step (b-2) and the step (d) are sequentially performed in an oxygen-free environment.

According to the structure for connecting interconnect lines of the first aspect of the present invention, good adhesion between the interposed layer and the second copper interconnect line is obtained. Further, the diffusion of metallic element from the first metal layer into the second copper interconnect line is prevented.

According to the structure for connecting interconnect lines of the second aspect of the present invention, even when there is a large difference in thermal expansion coefficient between the material for the interlayer insulating film and copper, the generation of a void is prevented in the second portion.

According to the structure for connecting interconnect lines of the third aspect of the present invention, the metallic compound layer is operable for reducing interconnection resistance while preventing diffusion of copper from the second copper interconnect line into the outside.

According to the structure for connecting interconnect lines of the fourth aspect of the present invention, the adhesion between the interposed layer and the first copper interconnect line is improved.

According to the structure for connecting interconnect lines of the fifth aspect of the present invention, the increase in interconnection resistance is prevented caused by the diffusion of metallic element into the first copper interconnect line.

According to the structure for connecting interconnect lines of the sixth aspect of the present invention, the interposed layer can be formed within one chamber in one manufacturing device. As a result, cost reduction is realized as compared with the structure including a plurality of chambers required for the layer to be formed of a plurality of metallic elements.

According to the structure for connecting interconnect lines of the seventh and eighth aspects of the present invention, the adhesion between the interposed layer and the second copper interconnect line is improved to a higher degree.

According to the structure for connecting interconnect lines of the ninth aspect of the present invention, the generation of a void in the second copper interconnect line and the diffusion of metallic element from the first metal layer into the second copper interconnect line are prevented.

According to the structure for connecting interconnect lines of the tenth aspect of the present invention, the generation of an oxide film at the interface between the first metal layer and the metallic compound layer is prevented. Therefore, the increase in interface resistance and poor adhesion therebetween are avoided.

According to the structure for connecting interconnect lines of the eleventh aspect of the present invention, the interposed layer can be formed with ease within one chamber in one manufacturing device. As a result, it is easy to sequentially form the metallic compound layer and the first metal layer in an oxygen-free environment.

According to the structure for connecting interconnect lines of the twelfth aspect of the present invention, the adhesion between the interposed layer and the second metal layer is improved. Further, the generation of an oxide film at the interface between the second metal layer and the metallic compound layer is prevented. Therefore, the increase in interface resistance and poor adhesion therebetween are avoided.

According to the structure for connecting interconnect lines of the thirteenth aspect of the present invention, the interposed layer can be formed with ease within one chamber in one manufacturing device. As a result, it is easy to sequentially form the metallic compound layer and the second metal layer in an oxygen-free environment.

According to the structure for connecting interconnect lines of the fourteenth aspect of the present invention, the diffusion of metallic element from the second metal layer into the first copper interconnect line is prevented.

According to the structure for connecting interconnect lines of the fifteenth aspect of the present invention, the generation of an oxide film between the second copper interconnect line and the interposed layer is prevented. Therefore, poor adhesion between the second copper interconnect line and the copper film and the increase in interconnection resistance are avoided.

It is therefore an object of the present invention to provide a technique for connecting interconnect lines for the improvement in reliability of copper interconnect lines.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
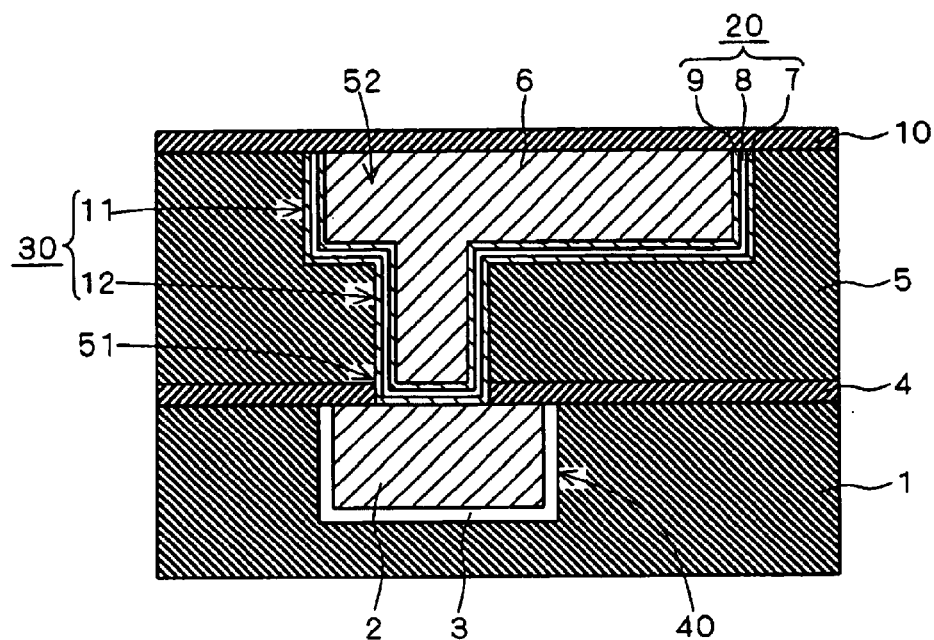
FIG. 1 is a sectional view illustrating a structure for connecting interconnect lines according to a first preferred embodiment of the present invention.

FIG. 1 is a sectional view illustrating the structure for connecting interconnect lines according to the first preferred embodiment of the present invention. A recessed portion 40 is provided in an insulating film 1 having an opening at the upper surface of the insulating film 1. Although not shown, a semiconductor substrate for holding a semiconductor element formed therein is provided under the insulating film 1 (that is, on the side opposite to the recessed portion 40). A first conductive barrier layer 3 is formed on the inner surfaces of the recessed portion 40, that is, on the bottom surface and side surfaces thereof. Also provided is a first copper interconnect line 2 for filling the recessed portion 40 through the first conductive barrier layer 3.

On the insulating film 1, the first conductive barrier layer 3 and the first copper interconnect line 2, a first insulating barrier layer 4 is formed having an opening 51 for partially exposing the upper surface of the first copper interconnect line 2. An interlayer insulating film 5 is formed on the first insulating barrier layer 4. The interlayer insulating film 5 includes a through hole 30 formed therein having an opening at the upper surface larger than the opening at the lower surface thereof. The through hole 30 can be defined as a structure including a trench 11 provided on the side opposite to the insulating film 1 and a contact hole 12 having a diameter smaller than that of the trench 11 and communicating with the opening 51 on the side of the insulating film 1.

A second conductive barrier layer 20 is formed on the inner surfaces of the through hole 30, that is, on the side surfaces thereof, on the side surfaces of the first insulating barrier layer 4 exposed at the opening 51 and on the upper surface of the first copper interconnect line 2 exposed at the opening 51. Also provided is a second copper interconnect line 6 for filling the through hole 30 and the opening 51 through the second conductive barrier layer 20. Accordingly, the second copper interconnect line 6 can be defined as a structure including a first portion for filling the trench 11 and a second portion of a diameter smaller than that of the first portion for filling the contact hole 12 or further filling the opening 51.

At an opening 52 of the through hole 30, namely, of the trench 11 provided on the side opposite to the opening 51, the upper surface of the second copper interconnect line 6 is exposed from the interlayer insulating film 5. The upper ends of the second conductive barrier layer 20 each defined between the upper surface of the second copper interconnect line 6 and the upper surface of the interlayer insulating film 5 are exposed at the opening 52.

The upper surface of the second copper interconnect line 6, the upper ends of the second conductive barrier layer 20 and the upper surface of the interlayer insulating film 5 are covered with a second insulating barrier layer 10.

Similar to the structure described in the background art, the foregoing structure of the present invention also applies a silicon oxide film, for example, as the insulating film 1 and the interlayer insulating film 5. As the first insulating barrier layer 4 and the second insulating barrier layer 10, a silicon carbide film, a silicon nitride film and the like are employed for increasing strength of the insulating film 1 and the interlayer insulating film 5, and for obtaining isolation between the layers. As the first conductive barrier layer 3, a metallic compound is employed for reducing interconnection resistance while preventing diffusion of copper from the copper interconnect lines into the insulating film 1.

In contrast to the structure in the background art, the present invention employs a stacked structure as the second conductive barrier layer 20 including a metal layer 7, a metallic compound layer 8 and a metal layer 9 sequentially stacked in this order when viewed from the side of the first copper interconnect line 2 and the interlayer insulating film 5. An element having an atomic weight higher than that of copper such as tungsten (W) or tantalum (Ta) is applicable as the material for the metal layers 7 and 9. Titanium nitride (TiN) may be applicable as the metallic compound layer 8, or it is preferable that the metallic compound layer 8 is made of a material as a main metallic element that is to be employed as the metal layers 7 and 9. More preferably, the metallic compound layer 8 should be formed of a compound including metal to be employed as the metal layers 7, 9 and nonmetallic material. If W, or alternatively Ta is employed as the material for the metal layers 7 and 9, it is preferable that the metallic compound layer 8 is made of WN or alternatively, TaN. This is because the second conductive barrier layer 20 can be formed within one chamber in one manufacturing device, to thereby realize cost reduction as compared with the structure including a plurality of chambers required for the layer to be formed of a plurality of metallic elements. Further, as the nonmetallic element to be employed as one of the materials for the metallic compound layer 8, Si or C may be applicable besides N. Alternatively, various types of nonmetallic elements selected from these are applicable as well.

The second copper interconnect line 6 is conductively connected to the first copper interconnect line 2 at the contact hole 12 through the second conductive barrier layer 20. As the ratio of the volume of the second copper interconnect line 6 at the region for filling the trench 11 to the volume of the second copper interconnect line 6 at the region for filling the contact hole 12 increases, tensile stress to be concentrated at the contact hole 12 becomes greater. As a result, a void is likely to be generated in the contact hole 12. In view of this, the adhesion should be improved especially between the region of the second copper interconnect line 12 for filling the contact hole 12 and the second conductive barrier layer 20. Therefore, the presence of the metal layer 9 to be provided between the second copper interconnect line 6 and the metallic compound layer 8 is essential especially. It is preferable, of course, to provide the first metal layer 7 for improving the adhesion of the second conductive barrier layer 20 to the first copper interconnect line 2.

Figure 2:
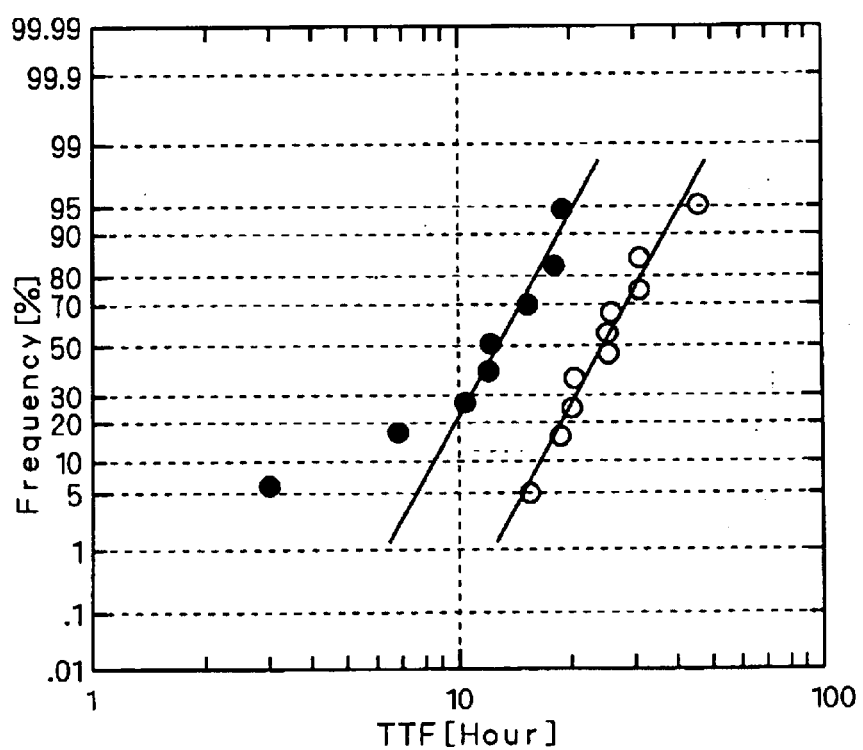
FIG. 2 is a graph showing performance of the structure for connecting interconnect lines according to the first preferred embodiment of the present invention.
Figure 13:
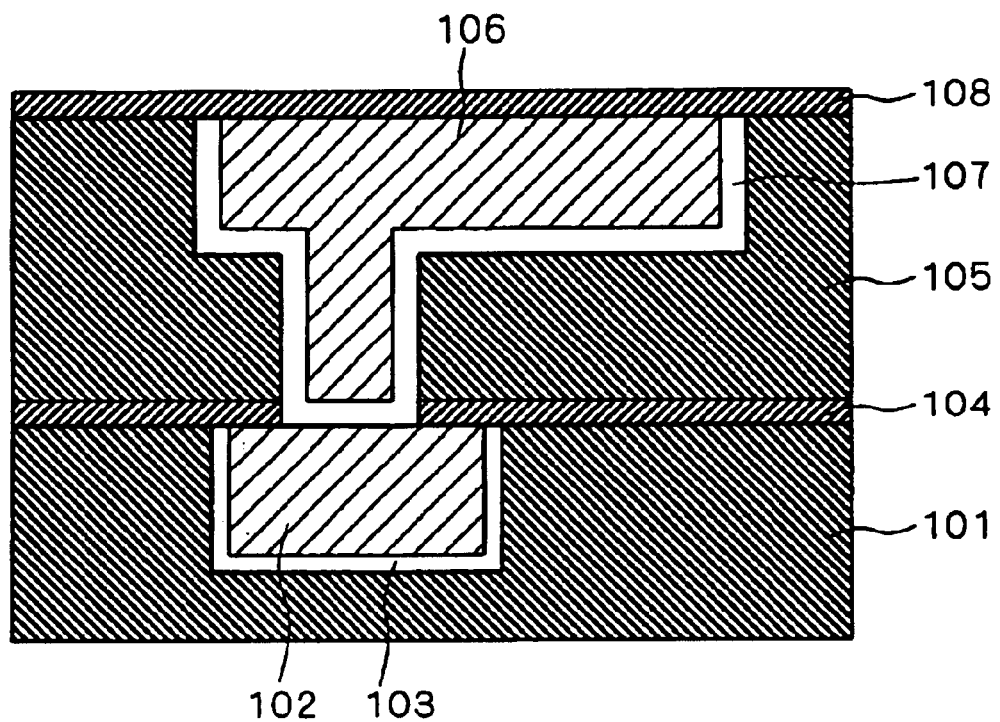
FIG. 13 is a sectional view illustrating a structure for connecting interconnect lines in the background art.

FIG. 2 is a graph showing life time of the structures until they reach a certain accumulated failure rate (TTF: time to failure) determined by an accelerated test. The line including closed circles is directed to the structure of the background art illustrated in FIG. 13, that is, to the structure including the copper interconnect line 106 having side surfaces and bottom surfaces covered with the second conductive barrier layer 107 made of a metallic compound. The line including open circles is directed to the structure according to the first preferred embodiment illustrated in FIG. 1, that is, to the structure including the second copper interconnect line 6 surrounded with the second conductive barrier layer 20. Here, a Ta film having a thickness of 10 nm is employed as the second conductive barrier layer 107 and the metallic compound layer 8. Further, a Ta film having a thickness of 5 nm and a Ta film having a thickness of 10 nm are employed as the metal layer 7 and the metal layer 9, respectively. It is seen from FIG. 2 that the structure according to the first preferred embodiment has a life time longer than that of the structure in the background art. The extension of life time results in the improvement in reliability.

As described above, the second copper interconnect line 6 according to the first preferred embodiment is defined as a structure including the first portion provided in the trench 11 and the second portion provided in the contact hole 12 and having a diameter smaller than that of the first portion. The second conductive barrier layer 20 is interposed between the second portion and the first copper interconnect line 2. The second conductive barrier layer 20 includes the metal layer 9 having contact with the second portion and made of an element having an atomic weight higher than that of copper. According to these structural features, good adhesion between the second copper interconnect line 6 and the second conductive barrier layer 20 is obtained. Moreover, the diffusion of metallic element from the metal layer 9 into the second copper interconnect line 6 is prevented. Further, the second copper interconnect line 6 is embedded in the interlayer insulating film 5. Here, even when there is a large difference in thermal expansion coefficient between the material for the interlayer insulating film (silicon oxide film, for example) and copper, the generation of a void is prevented in the second portion defined as the contact hole 12 or the opening 51.

Further, the second conductive barrier layer 20 includes the metallic compound layer 8 provided on the side opposite to the second copper interconnect line 6 with the metal layer 9 interposed therebetween. According to this structure, it is possible to reduce interconnection resistance while preventing diffusion of copper from the second copper interconnect line 6 into the outside.

Still further, the second conductive barrier layer 20 includes the metal layer 7 having contact with the first copper interconnect line 2. Therefore, the adhesion of the second conductive barrier layer 20 to the first copper interconnect line 2 can be improved. To avoid increase in interconnection resistance caused by the diffusion of metallic element into the first copper interconnect line 2, it is preferable to employ an element as the material for the metal layer 7 as well having an atomic weight higher than that of copper.

In order to obtain better adhesion between the second conductive barrier layer 20 and the second copper interconnect line 6, it is preferable that the metal layer 9 has a thickness larger than that of the metallic compound layer 8. It is further preferable that the thickness of the metal layer 9 is 1 nm or more.

Second Preferred Embodiment

The second preferred embodiment is directed to the method of manufacturing the structure for connecting interconnect lines illustrated in FIG. 1. FIGS. 3 through 8 are sectional views sequentially illustrating the steps of this manufacturing method.

Figure 3:
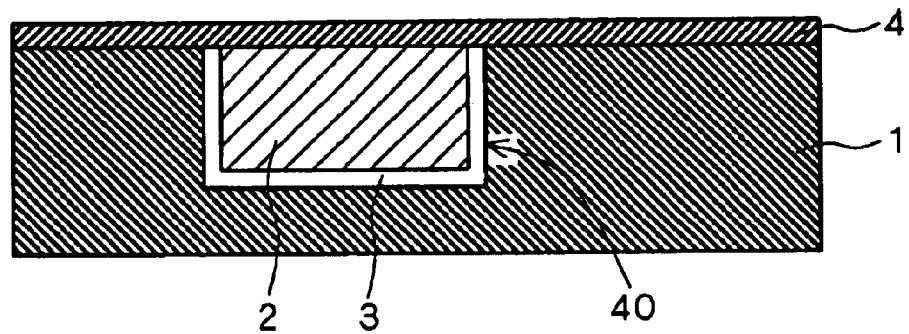
FIGS. 3 through 8 are sectional views sequentially illustrating the steps of a method of manufacturing the structure for connecting interconnect lines according to a second preferred embodiment of the present invention.

First, the structure illustrated in FIG. 3 should be given. The recessed portion 40 is provided at one main surface of the insulating film 1. The first conductive barrier layer 3 is formed on the bottom surface and side surfaces of the recessed portion 40. The recessed portion 40 is filled with the first copper interconnect line 2 through the first conductive barrier layer 3. The first conductive barrier layer 3 is formed of TaN, for example, by using a PVD method or a CVD method to grow to a thickness such as 10 nm. The first copper interconnect line 2 is formed by using a PVD method, a CVD method or a plating method. An embedding interconnection technique or alternatively, patterning process using dry etching is applicable for filling the recessed portion 40 with the first copper interconnect line 2.

Also provided under the insulating film 1 (that is, on the side opposite to the recessed portion 40) is a semiconductor substrate (not shown) for holding a semiconductor element formed therein. A silicon oxide film is applicable, for example, as the insulating film 1.

After the recessed portion 40 is filled with the first copper interconnect line 2, the first insulating barrier layer 4 is formed all over the surface of the insulating film 1. As the first insulating barrier layer 4, a silicon nitride film, a silicon carbide film and the like are applicable. Following these steps, the structure illustrated in FIG. 3 is given.

Figure 4:
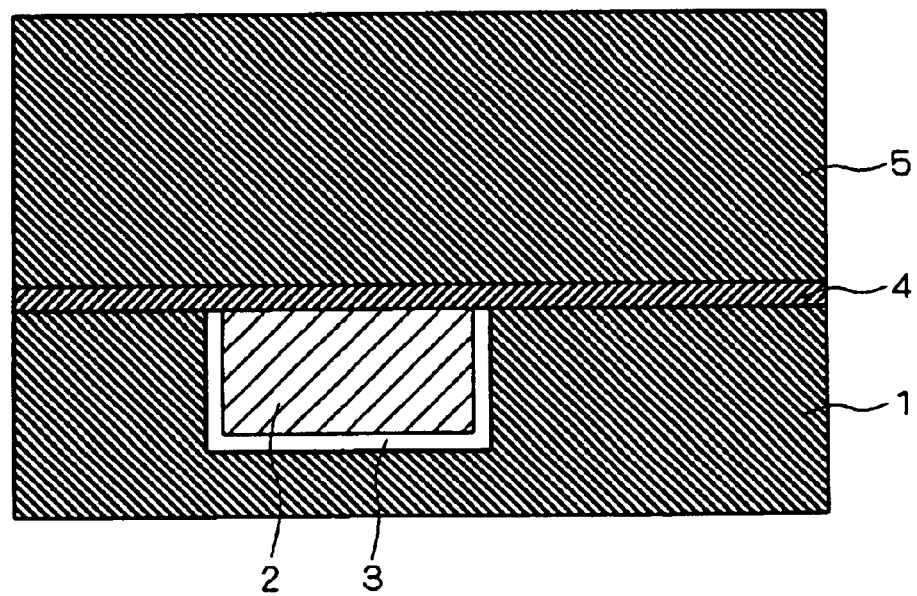

Next, the interlayer insulating film 5 made of silicon oxide and the like is formed on the first insulating barrier layer 4 to obtain the structure illustrated in FIG. 4. The through hole 30 including the trench 11, the contact hole 12 and the opening 51 are formed in the interlayer insulating film 5 and in the first insulating barrier layer 4, respectively, through dry etching. The formation of the trench 11 creates the opening 52. Following these steps, the structure is given illustrated in FIG. 5 including the first copper interconnect line 2 having the upper surface partially exposed.

Figure 5:
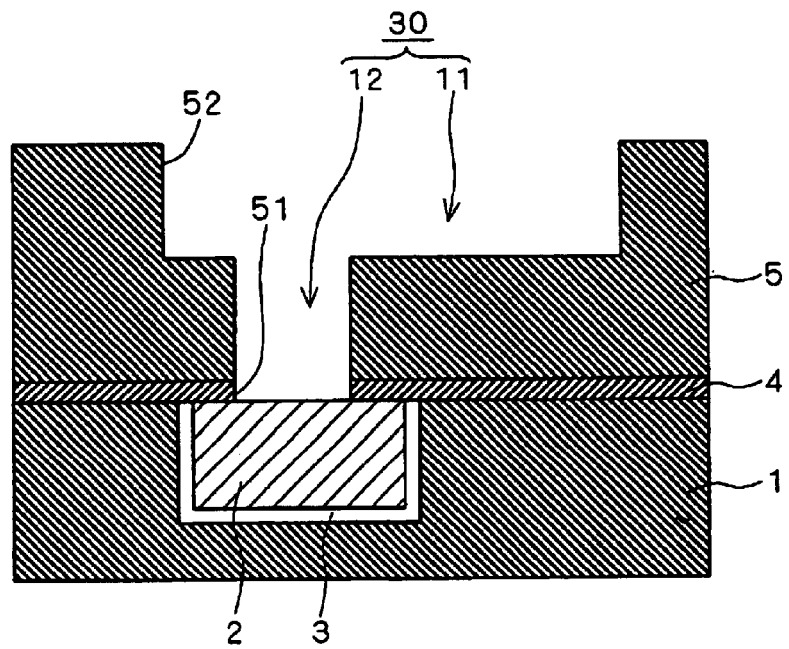
Figure 6:
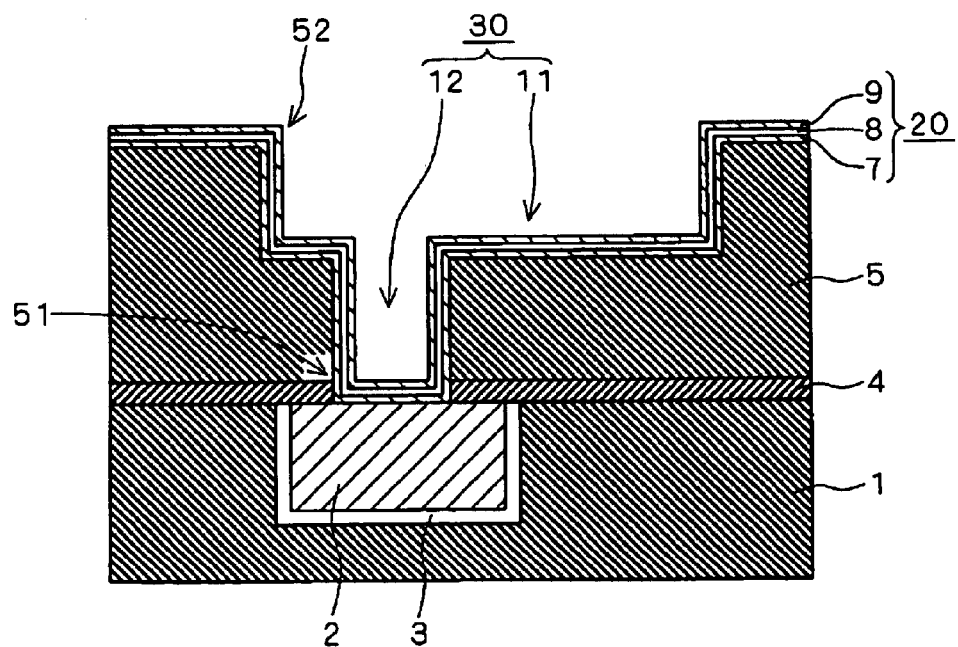
Figure 7:
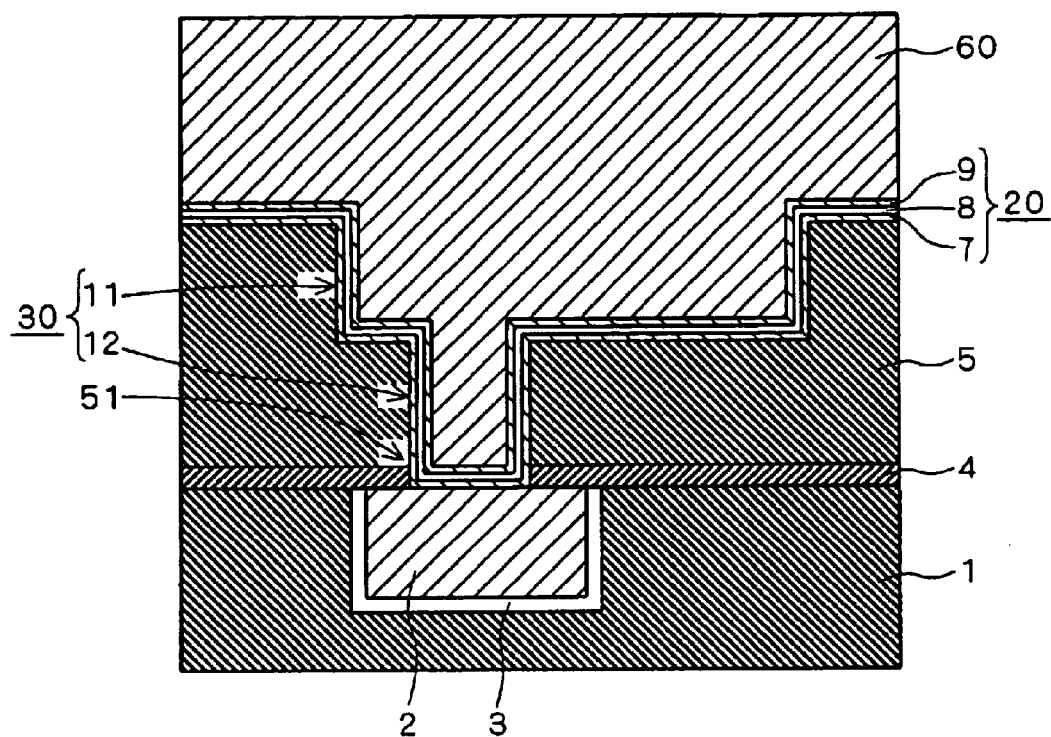

Thereafter, the metal layer 7 is deposited all over the structure illustrated in FIG. 5, namely, on the upper surface of the first copper interconnect line 2 exposed at the opening 51, the side surfaces of the first insulating barrier layer 4 and the surfaces of the interlayer insulating film 5. The metallic compound layer 8 and the metal layer 9 are stacked in this order on the metal layer 7 to constitute the second conductive barrier layer 20. The structure illustrated in FIG. 6 is thereby given.

The metal layer 7, the metallic compound layer 8 and the metal layer 9 should preferably be formed sequentially in an oxygen-deficient environment (which is referred to as "oxygen-free environment" in the present specification and claims). For example, they should preferably be formed sequentially in an evacuated chamber. The second conductive barrier layer 20 formed in this manner prevents generation of an oxide layer at each interface between the metal layer 7, the metallic compound layer 8 and the metal layer 9. As a result, the increase in interface resistance and poor adhesion in the stacked structure of metal layer 7/metallic compound layer 8/metal layer 9 resulting from the presence of this oxide layer are avoided. As described in the first preferred embodiment, it is preferable that the metallic compound layer 8 is made of a material as a main metallic element that is to be employed as the metal layers 7 and 9.

More preferably, the metallic compound layer 8 should be formed of a compound including metal to be employed as the material for the metal layers 7, 9 and nonmetallic material. This is because the second conductive barrier layer 20 can be easily formed within one chamber in one manufacturing device and therefore, the metal layer 7, the metallic compound layer 8 and the metal layer 9 can be sequentially formed with ease in an oxygen-free environment.

Next, a copper film 60 is formed on the second conductive barrier layer 20, namely, to be in contact with the metal layer 9 by using a PVD method, a CVD method or a plating method. The opening 51 and the through hole 30 are thereby filled with the copper film 60 to obtain the structure illustrated in FIG. 7.

As a subsequent step, the copper film 60 and the second conductive barrier layer 20 are removed at a region above (that is, apart from the first copper interconnect line 2) the through hole 30. A CMP method is employed, for example, for this removal. The second copper interconnect line 6 is thereby formed for filling the opening 51 and the through hole 30 to obtain the structure illustrated in FIG. 8.

Figure 8:
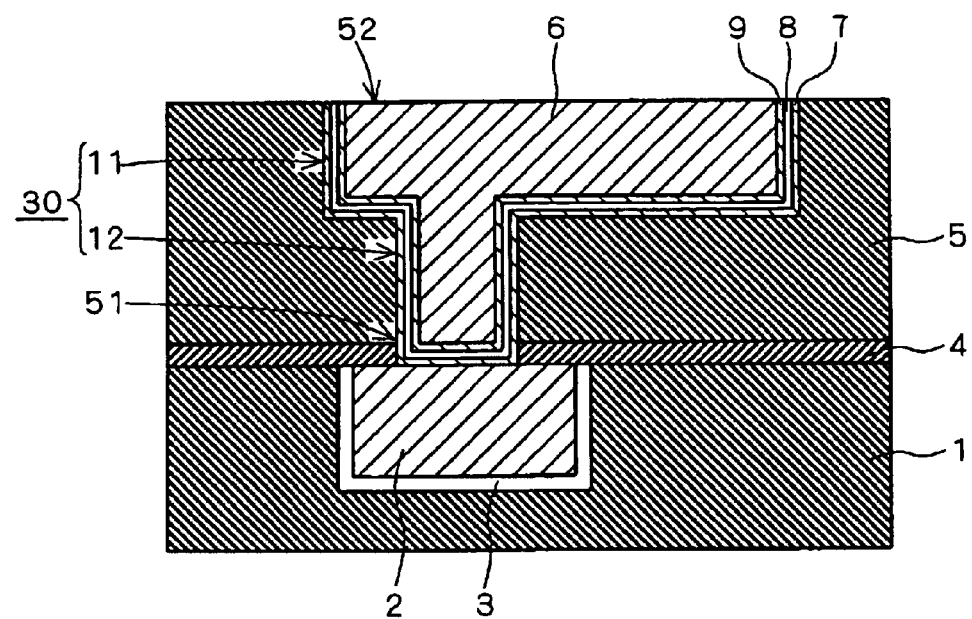

The second insulating barrier layer 10 is then formed all over the structure illustrated in FIG. 8, namely, on the upper surface of the second copper interconnect line 6 exposed at the opening 52, the upper ends of the second conductive barrier layer 20 and the upper surface of the interlayer insulating film 5. The structure illustrated in FIG. 1 is thereby given. As the second insulating barrier layer 10, a silicon nitride film and a silicon carbide film are applicable, for example.

According to the second preferred embodiment, the second copper interconnect line is formed on the metal layer 9 that is formed in the previous step as described above. As a result, the generation of a void in the second copper interconnect line and the diffusion of metallic element from the metal layer 9 into the second copper interconnect line 6 can be prevented as described in the first preferred embodiment.

Further, the metal layer 7, the metallic compound layer 8 and the metal layer 9 are sequentially formed in an oxygen-free environment to constitute the second conductive barrier layer 20. As a result, the increase in interface resistance and poor adhesion in the second conductive barrier layer 20 having a stacked structure can be avoided.

The same materials for the metal layer 7, the metallic compound layer 8, the metal layer 9 and the same thicknesses thereof as those in the first preferred embodiment are also applicable to the second preferred embodiment.

Third Preferred Embodiment

FIGS. 9 through 12 are sectional views sequentially illustrating the steps of a method of manufacturing the structure for connecting the interconnect lines according to the present invention. First, following the same steps as in the second preferred embodiment, the structure illustrated in FIG. 5 is given. Thereafter the second conductive barrier layer 20 is formed following the same steps as in the second preferred embodiment. That is, the metal layer 7, the metallic compound layer 8 and the metal layer 9 are sequentially formed in an oxygen-free environment.

Figure 9:
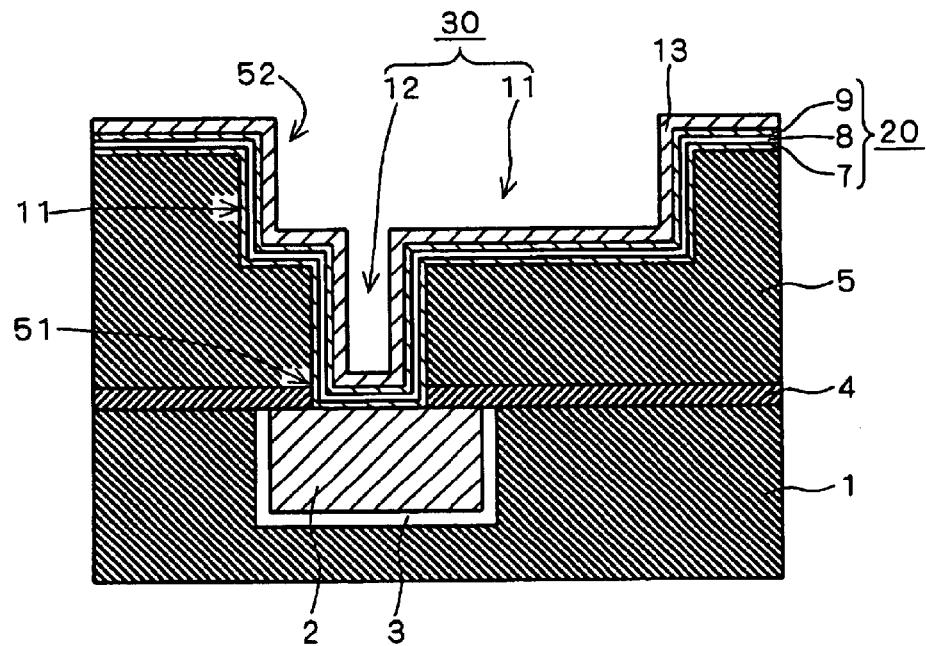
FIGS. 9 through 12 are sectional views sequentially illustrating, the steps of a method of manufacturing the structure for connecting interconnect lines according to a third preferred embodiment of the present invention.
Figure 10:
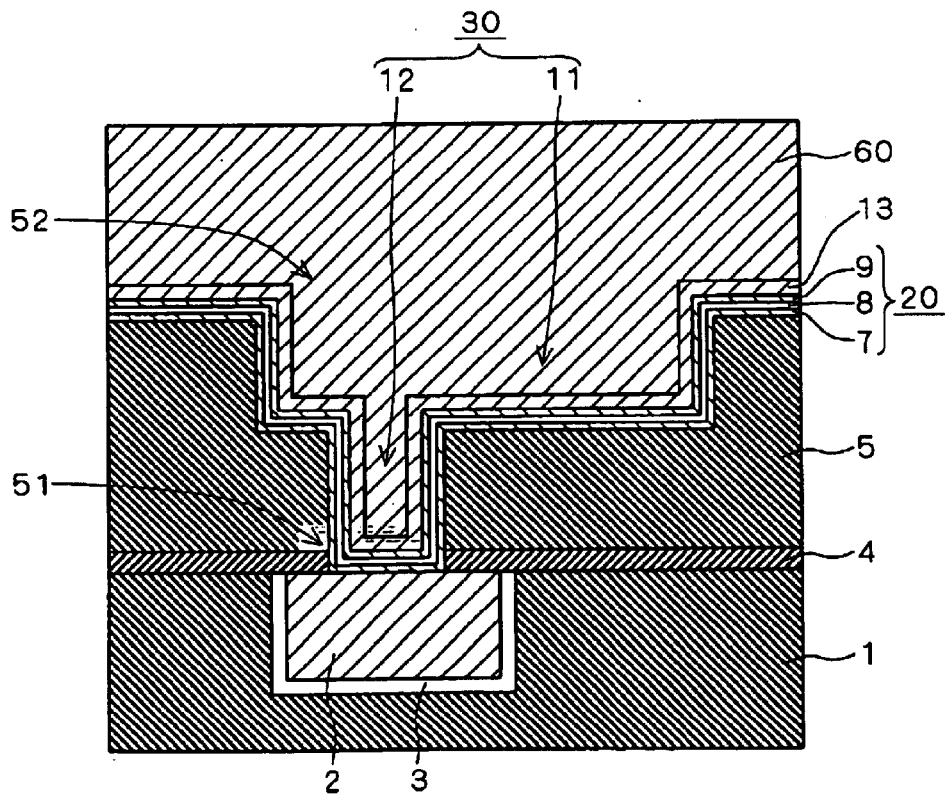

The third preferred embodiment characteristically provides a copper film 13 on the metal layer 9 in an oxygen-free environment subsequently to the formation of the metal layer 9. The structure illustrated in FIG. 9 is thereby given.

Further characteristically, the third preferred embodiment forms the copper film 60 through electrolytic plating using the copper film 13 as a seed layer. The opening 51 and the through hole 30 are thereby filled with the copper film 60 to obtain the structure illustrated in FIG. 10.

Next, following the same steps as in the second preferred embodiment, the copper film 60 and the second conductive layer 20 are removed at the region above the through hole 30. Here, a difference is made from the second preferred embodiment in that the copper film 13 is further removed at the region above the through hole 30. A CMP method is employed, for example, for this removal. The second copper interconnect line 6 is thereby formed for filling the opening 51 and the through hole 30 to obtain the structure illustrated in FIG. 11.

Figure 11:
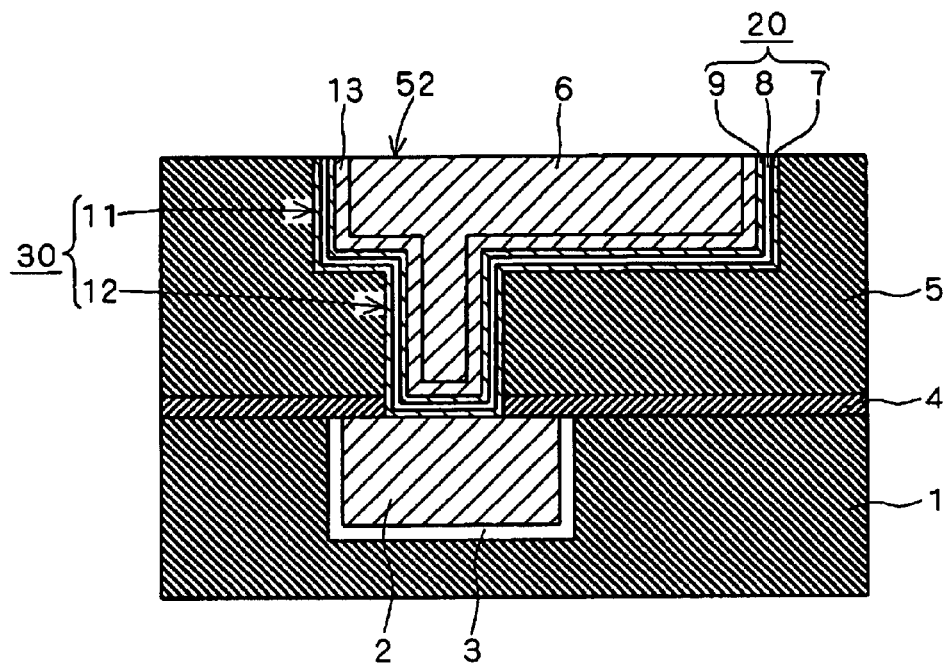
Figure 12:
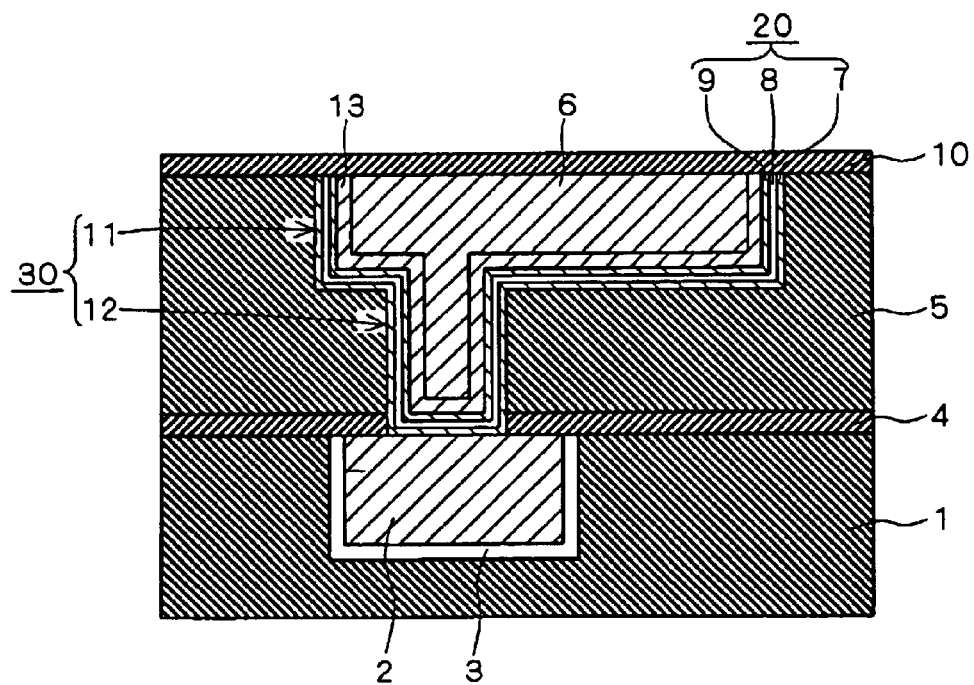

Thereafter the second insulating barrier layer 10 is formed all over the structure illustrated in FIG. 11, namely, on the upper surface of the second copper interconnect line 6 exposed at the opening 52, the upper ends of the second conductive barrier layer 20, the upper ends of the copper film 13 and the upper surface of the interlayer insulating film 5. The structure illustrated in FIG. 12 is thereby given.

According to the third preferred embodiment, the copper film 13 is formed on the metal layer 9 in an oxygen-free environment subsequently to the formation of the metal layer 9. Therefore, good adhesion between the copper film 13 and the metal layer 9 is obtained. Further, the generation of an oxide film is prevented at the interface between the copper film 13 and the metal layer 9, that is, between the second copper interconnect line 6 and the second conductive barrier layer 20. As the copper film 60 to serve as the second copper interconnect line 6 after shaping is provided through electrolytic plating using the copper film 13 as a seed layer, good adhesion is obtained as well between the second copper interconnect line 6 and the copper film 13. For this reason, the third preferred embodiment is effective in preventing the increase in interconnection resistance and poor adhesion.

The same materials for the metal layer 7, the metallic compound layer 8, the metal layer 9 and the same thicknesses thereof as those in the first preferred embodiment are also applicable to the third preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a structure for connecting interconnect lines, comprising the steps of;

(a) forming a first copper interconnect line;
   (b) forming an interposed layer on said first copper interconnect line; and
   (c) forming a second copper interconnect line on said interposed layer, wherein said step (b) comprises the steps of;

(b-1) forming a metallic compound layer after said step (a); and
   (b-2) forming a first metal layer on said metallic compound layer, the first metal layer having a thickness larger than a thickness of the metallic compound layer, contact is established between said second copper interconnect line and said first metal layer in said step (c), and said first metal layer is made of a metallic element having an atomic weight higher than that of copper.

2. The method according to claim 1, wherein said step (b-1) and said step (b-2) are sequentially performed in an oxygen-free environment.

3. The method according to claim 2, wherein said metallic compound layer includes said metallic element as a main metallic substance which is a material for said first metal layer.

4. The method according to claim 3, wherein said step (b) further comprises step of (b-3) forming a second metal layer to be in contact with said first copper interconnect line, and said step (b-3), said step (b-2) and said step (b-1) are sequentially performed in this order in an oxygen-free environment.

5. The method according to claim 4, wherein said metallic compound layer includes a metallic element as a main metallic substance which is a material for said second metal layer.

6. The method according to claim 5, wherein said second metal layer is made of said metallic element having an atomic weight higher than that of copper.

7. The method according to claim 6, further comprising the step of:

(d) forming a copper film on said first metal layer between said step (b) and said step (c), wherein said second copper interconnect line is formed through electrolytic plating using said copper film as a seed layer, and said step (b-2) and step (d) are sequentially performed in an oxygen-free environment.

* * * * *